United States Patent
Junkins et al.

(10) Patent No.: US 10,111,365 B1
(45) Date of Patent: Oct. 23, 2018

(54) MOUNTING ELECTRONIC DEVICE TO THERMALLY CONDUCTIVE PAD OF LIQUID-COOLING MECHANISM IN TRANSLATIONAL MOVEMENT-MINIMIZING MANNER

(71) Applicant: Lenovo Enterprise Solutions (Singapore) PTE. LTD., New Tech Park (SG)

(72) Inventors: Andrew Thomas Junkins, Morrisville, NC (US); Vinod Kamath, Morrisville, NC (US)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 15/857,129

(22) Filed: Dec. 28, 2017

(51) Int. Cl.
| | |
|---|---|
| *G06F 1/18* | (2006.01) |
| *H05K 5/00* | (2006.01) |
| *H05K 7/20* | (2006.01) |
| *G06F 1/20* | (2006.01) |

(52) U.S. Cl.
CPC ........ *H05K 7/20772* (2013.01); *G06F 1/20* (2013.01); *G06F 1/203* (2013.01); *H05K 7/20254* (2013.01); *H05K 7/20272* (2013.01)

(58) Field of Classification Search
CPC ...................................................... G06F 1/18
USPC .................................................. 361/679.01
See application file for complete search history.

(56) References Cited

U.S. PATENT DOCUMENTS

| | | |
|---|---|---|
| 5,495,389 A | 2/1996 | DeWitt et al. |
| 5,566,383 A | 10/1996 | Gildea et al. |
| 5,572,402 A | 11/1996 | Jeong |
| 5,584,396 A | 12/1996 | Schmitt |
| 5,701,231 A | 12/1997 | Do et al. |
| 5,774,337 A | 6/1998 | Lee et al. |
| 5,784,251 A | 7/1998 | Miller et al. |
| 5,784,252 A | 7/1998 | Villa et al. |
| 5,973,918 A | 10/1999 | Felcman et al. |
| 5,995,364 A | 11/1999 | McAnally et al. |
| 6,404,625 B1 | 6/2002 | Chen et al. |
| 6,445,576 B1 | 9/2002 | Wooden et al. |
| 6,700,776 B2 | 3/2004 | Bang et al. |
| 6,781,941 B1 | 8/2004 | Gerber et al. |
| 7,254,018 B2 | 8/2007 | Zhang et al. |
| 7,257,827 B2 | 8/2007 | Lee |
| 7,352,576 B2 | 4/2008 | McClure |
| 7,433,183 B2 | 10/2008 | Huang |
| 8,427,835 B2 | 4/2013 | Xu et al. |
| 8,462,502 B2 | 6/2013 | Hirano et al. |
| 9,380,722 B2 | 6/2016 | Junkins et al. |
| 2002/0085347 A1 | 7/2002 | Erickson et al. |
| 2005/0135068 A1 | 6/2005 | Huff |

(Continued)

*Primary Examiner* — Jerry Wu
(74) *Attorney, Agent, or Firm* — Jason Friday

(57) ABSTRACT

A liquid-cooling mechanism, or sub-system, has a thermally conductive plate in which a cooling liquid channel is disposed, and a thermally conductive pad disposed on the thermally conductive plate. An electronic device is mounted to the thermally conductive pad, such as via a mounting component, in a manner that decreases translational movement of a contact surface of the electronic device against a contact surface of the thermally conductive pad. When mounted to the thermally conductive pad, the electronic device compresses the thermally conductive pad.

13 Claims, 7 Drawing Sheets

(56) References Cited

U.S. PATENT DOCUMENTS

2015/0366095 A1* 12/2015 Junkins ................ H05K 5/0256
361/679.31
2016/0054767 A1* 2/2016 Chen ....................... G06F 1/187
361/679.39
2016/0128237 A1* 5/2016 Szeremeta ........... G11B 33/128
361/679.31

* cited by examiner

MOUNTING ELECTRONIC DEVICE TO THERMALLY CONDUCTIVE PAD OF LIQUID-COOLING MECHANISM IN TRANSLATIONAL MOVEMENT-MINIMIZING MANNER

BACKGROUND

Computing devices like computers, such as server, desktop, and laptop computers, include components that generate heat. To ensure the proper operation of a computing device and to prevent failure of its components, the generated heat has to be removed from the device. Heat removal can be achieved passively (i.e., natural convection), such as via heat sinks and enclosure vents or holes, as well as actively, such as via fans exhausting heated air from and/or introducing cooled air to the computing devices (i.e., forced convection).

SUMMARY

An example method includes providing a liquid-cooling mechanism having a thermally conductive plate in which a cooling liquid channel is disposed and having a thermally conductive pad disposed on the thermally conductive plate. The method includes mounting an electronic device to the thermally conductive pad in a manner that decreases translational movement of a contact surface of the electronic device against a contact surface of the thermally conductive pad.

An example liquid-cooling sub-system includes a thermally conductive plate having a cooling liquid channel within which cooling liquid is circulated. The liquid-cooling sub-system includes a thermally conductive pad disposed on the thermally conductive plate. The sub-system includes a mounting component permitting mounting of an electronic device against the thermally conductive pad in a manner that decreases translational movement of a contact surface of the electronic device against a contact surface of the thermally conductive pad.

An example computing system includes a thermally conductive plate having a cooling liquid channel within which cooling liquid is circulated. The computing system includes a thermally conductive pad disposed on the thermally conductive plate, and an electronic device. The system includes a mounting component removably mounting the electronic device against the thermally conductive pad in a manner that decreases translational movement of a contact surface of the electronic device against a contact surface of the thermally conductive pad.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figure 1:
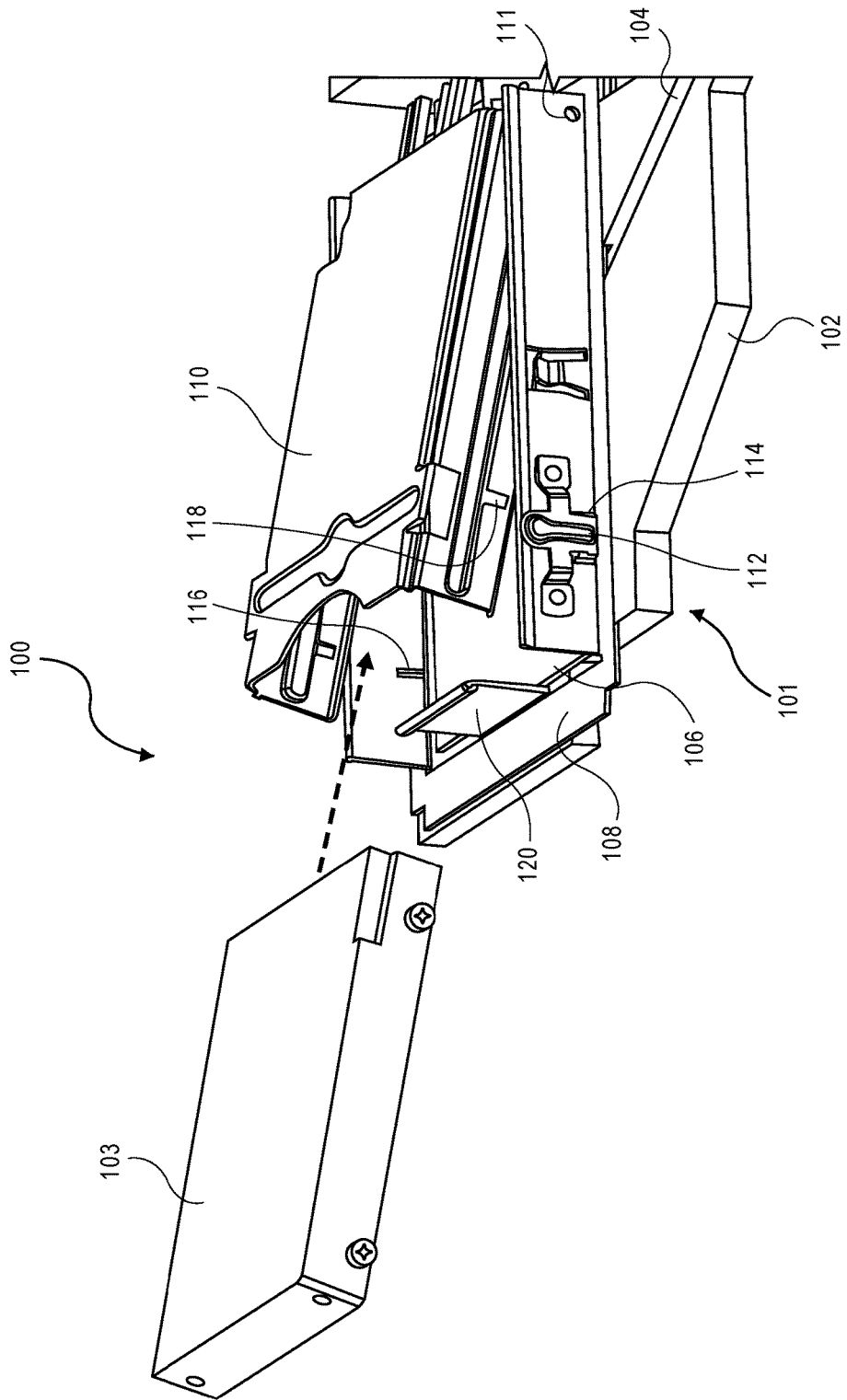
FIG. 1 is a perspective view diagram of an example computing system including an example liquid-cooling sub-system and a storage device.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As noted in the background section, computers and other computing devices generate heat that has to be removed to maintain optimal computing device performance. Whereas conventionally heat removal has been achieved passively and via active airflow, more recently water cooling, or more generally liquid cooling, has been employed to maintain temperatures of computing components within their rated specifications. Liquid cooling generally involves circulating a liquid within tubing past or against heat-generating components.

More specifically, the heat that a computing component generates is transferred passively or actively to the cooling liquid. The heat absorbed within the liquid is then transferred from the liquid once the liquid has circulated out of the computing device. For example, the heat may be released into the ambient environment, or may be recovered to use as a source of building heat, and so on. The liquid thus circulates in a closed loop, absorbing heat from components, and releasing heat away from the components.

Liquid cooling has been commonly employed for integrated circuits (ICs) disposed within computing devices, such as processors, memory, and so on. Such ICs may be the primary sources of heat within a computing device. To cool an IC using liquid cooling, the liquid tubing may be placed on or through the fins of a heat sink thermally coupled to the IC. A pump is often incorporated for circulating the fluid in a closed loop system between the hot IC and the heat dissipation elements of the cooling system. The heat generated by the IC is transferred to the moving fluid due to the sustained temperature gradient between the hot IC and the cooler fluid. This heat is ultimately released from the fluid to the environment. The heat dissipation elements may dissipate the heat via a local fluid to air heat exchanger, a remote liquid to air heat exchanger, or a remote liquid to liquid heat exchanger.

Techniques described herein permit other types of components, such as computing components or other electronic components, to be liquid cooled as well. Such components can include storage components like hard disk drives (HDDs) and solid state drives (SSDs). The techniques described herein provide for mounting of an electronic component to a thermally conductive pad of a liquid-cooling mechanism in a way that decreases, including minimizing, parallel translational movement of the electronic component relative to the thermally conductive pad. Translational movement can include linearly moving the electronic component along the thermally conductive pad's surface.

This translational movement can damage sensitive electronics that may be exposed on the surface of the electronic component that comes into contact with the thermally conductive pad. Furthermore, such translational movement can make mounting of the electronic component to the thermally conductive pad difficult, since for optimal thermal contact, the electronic component should perpendicularly compress the pad. Therefore, the techniques described herein decrease, including minimizing, the potential for damage during electronic component mounting to the thermally conductive pad, and ease the mounting process as well.

FIG. 1 shows a perspective view of a portion of an example computing system 100. The system 100 includes an example liquid-cooling sub-system 101 and a storage device 103. The storage device 103 is more generally a computing or electronic component or device that is part of the computing system 100, which may itself by a computing device like a server, desktop, or laptop computing device. The storage device 103 may be an HDD or an SSD, as specifically shown in FIG. 1.

The liquid-cooling sub-system 101 includes a thermally conductive plate 102 and a thermally conductive pad 106. The thermally conductive plate 102 may be made of a rigid and thermally insulating material, and includes a cooling liquid channel 104 within which a cooling liquid, such as water, is circulated. The thermally conductive pad 106 may be of a pliant or flexible, electrically insulating, and thermally conductive material, and is disposed on the thermally conductive plate 102, such as over the cooling liquid channel 104.

The liquid-cooling sub-system 101 includes a bracket 108, a bay 110, and a latch 112, which together can constitute a mounting component of the sub-system 101. The bracket 108 is fixedly attached to the thermally conductive plate 102, and has an opening through the thermally conductive pad 106 disposed on the plate 102 is exposed. The bay 110 is rotationally mounted to the bracket 108 at an axis of rotation 111. There may be a latch 112 at each side of the bracket 108. A latch 112 includes a latching pin 114 that extends through a hole 116 of the bracket 108.

The bay 110 has a slot receptive to insertion of the storage device 103. Once the storage device 103 has been inserted into the bay 112, the bay 110 can be rotated counter-clockwise until a bottom surface of the storage device 103 has compressed a top surface of the thermally conductive pad 106. Compression of the storage device 103 against the thermally conductive pad 106 promotes heat conduction from the storage device 103 to the pad 106, which is then transferred to the cooling liquid circulating under the pad 106 through the channel 104, and ultimately away from the computing system 100 (such as outside of an enclosure thereof).

During the rotational movement, a bottom edge of the bay 110 may temporarily push the latching pin 114 out from the slot, until a latching hole 118 of the bay 110 has aligned with the hole 116 of the bracket 108. At that time, the latching pin 114 may revert into the slot 114, through the holes 116 and 118. The latching pin 114 thus maintains the storage device 103 positioned against the thermally conductive pad 106. Pressing a top part of the latching pin 112 temporarily rotates the latching pin 114 out of the holes 116 and 118, permitting rotation of the bay 110 clockwise away from the thermally conductive pad 106 to permit removal of the storage device 103.

Mounting of the storage device 103 to the thermally conductive pad 106 via rotational movement of the bay 110 after the storage device 103 has been inserted into the bay 110 can be achieved in a toolless manner. That is, no tools like screwdrivers are necessary to secure the storage device 103 against the thermally conductive pad 106. Furthermore, mounting of the storage device 103 to the thermally conductive pad 106 via rotational movement of the bay 110 after the storage device 103 has been inserted into the bay 110 decreases, including minimizing, translational movement of the device 103 linearly across the pad 106 during this mounting.

For example, if a front tab 120 of the bracket 108 were not present, and the bay 110 permanently disposed within the bracket 108 (i.e., in the position in which the bay 110 is rotated counter-clockwise as far as the bay 110 can be so rotated), then the storage device 103 would be linearly translated into the bay 110 to mount the device 103 against the pad 106. As such, the thermally conductive pad 106 would interfere with the bottom surface of the storage device 103 during mounting of the device 103, since successful mounting of the device 103 against the pad 106 involves the former compressing the latter. This interference can damage exposed components on the bottom surface of the storage device 103, and generally makes it physically difficult to mount the device 103 against the pad 106. Furthermore, such translation can damage the thermally conductive pad 106.

In another implementation, the bay 110 may not be rotationally attached to the bracket 108 at the rotational axis 111. As such, the bay 110 is removable from the bracket 108. In such an implementation, to mount the storage device 103 to the thermally conductive pad 106, the storage device 103 is inserted into the bay 110 when the bay 110 is removed from the bracket 108. The bay 110, with the inserted storage device 103, is secured into the bracket 108 in a direction perpendicular to the plane of the surface of the thermally conductive pad 106 to complete mounting of the storage device 103 to the pad 106. Therefore, in this implementation, translation movement of the device 103 linearly across the pad 106 may not only be minimized but also substantially eliminated.

Figure 2:
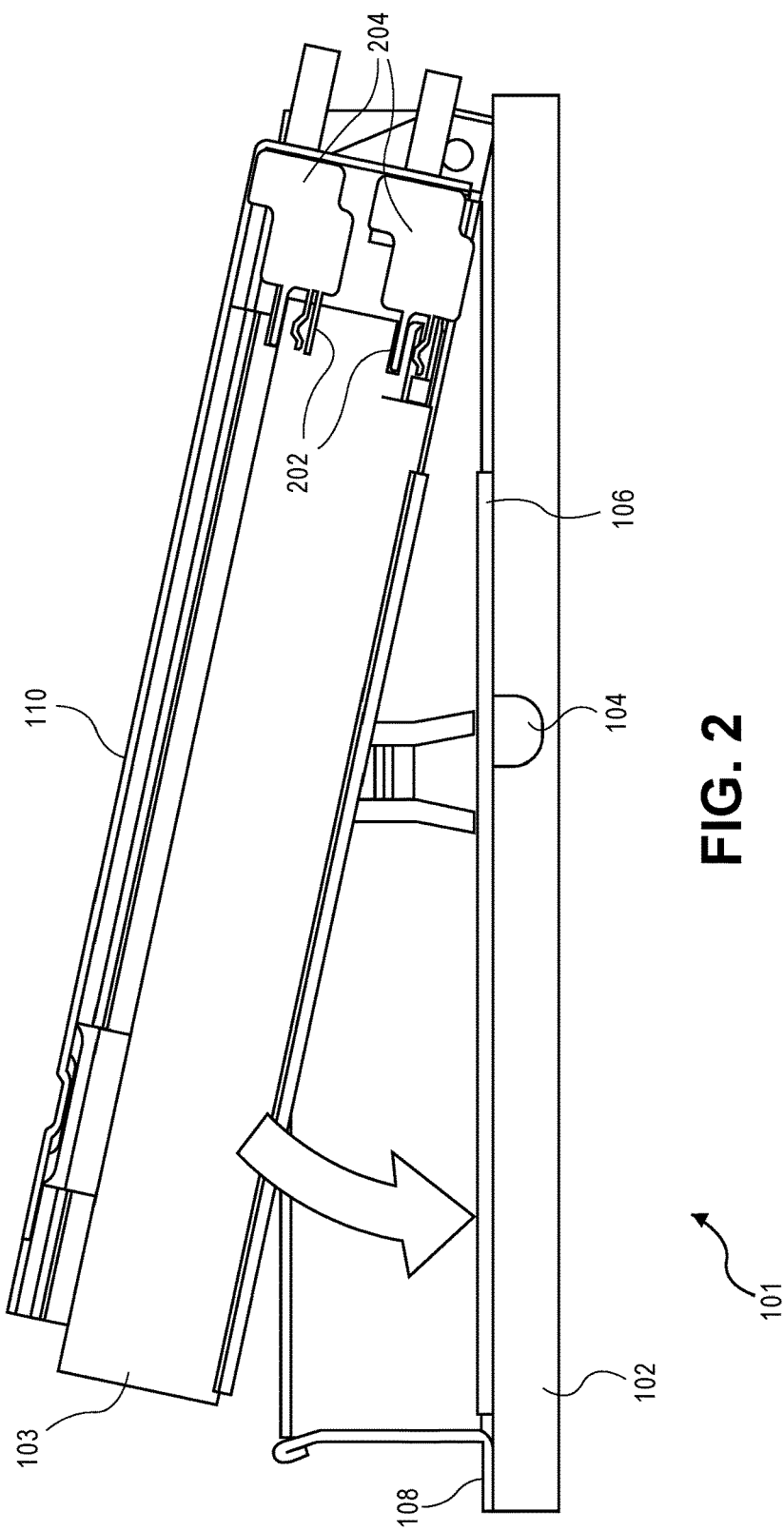
FIGS. 2 and 3 are cross-sectional view diagrams of the example liquid-cooling sub-system and the storage device of FIG. 1.
Figure 3:
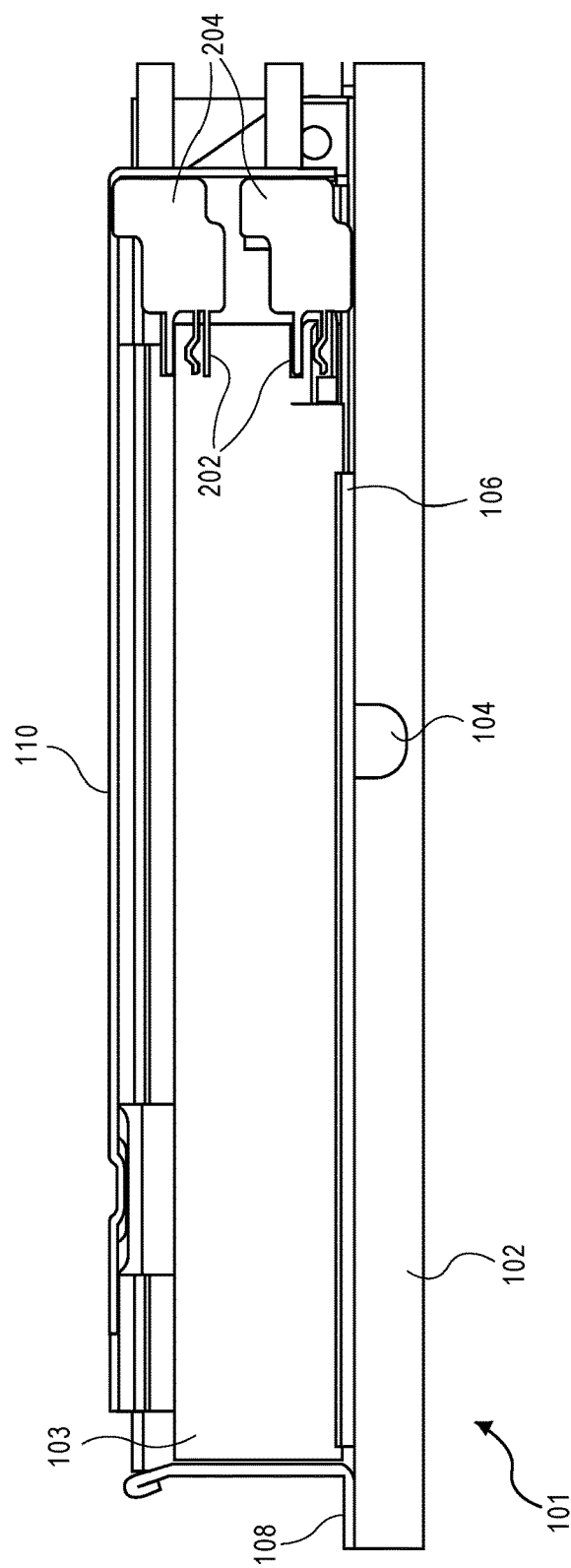

FIGS. 2 and 3 shows cross-sectional views of the example liquid-cooling sub-system 101 and the storage device 103. The thermally conductive plate 102 with the cooling liquid channel 104 is depicted in FIGS. 2 and 3, as are the thermally conductive pad 106, the bracket 108, and the bay 110. In FIG. 2, the storage device 103 has been inserted into the bay 110 but the bay 110 has not yet been rotated counter-clockwise to secure or mount the device 103 against the thermally conductive pad 106. In FIG. 3, by comparison, the bay 110 with the inserted storage device 103 has been completely routed so that the device 103 is mounted against the pad 106, compressing the thermally conductive pad 106.

As specifically shown in FIGS. 2 and 3, the storage device 103 can include one or more connectors 202. The connectors 202 conductively mate with one or more corresponding connectors 204 situated at the back of the bay 110 when the storage device 103 is inserted into the bay 110. The connectors 204 themselves may have cables extending therefrom that connect to a logic board, such as a mainboard, of the computing system 100 of which the sub-system 101 and the storage device 103 are a part. Via these connections, the storage device 103 can therefore receive power from the logic board, and also communicate data with the logic board.

Figure 4A:
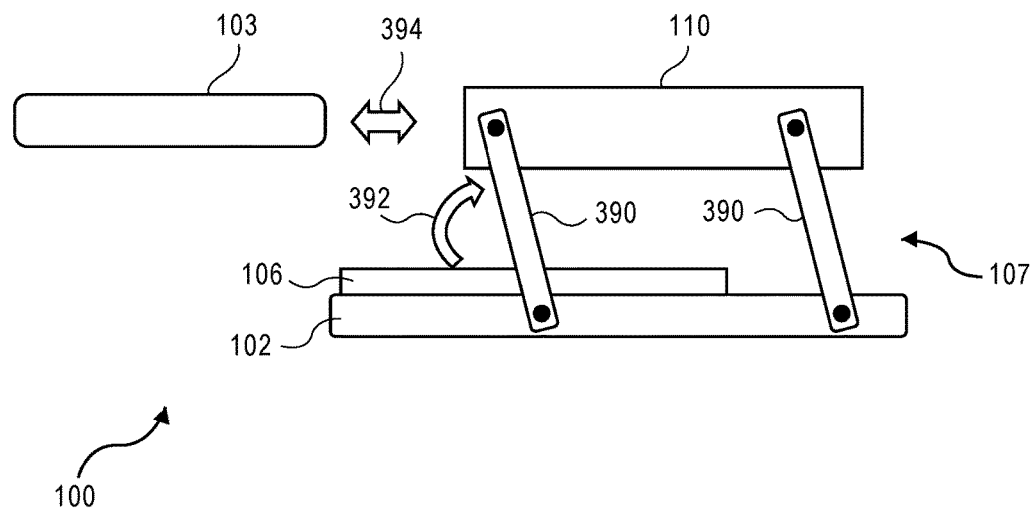
FIG. 4A is a front view diagram of an example computing system including another example liquid-cooling sub-system and a storage device, in which the sub-system is in an open position.

FIG. 4A shows a front view of the example computing system 100 including another example liquid-cooling sub-system 101 and the storage device 103. The liquid-cooling sub-system 101 of FIG. 4A includes the thermally conductive plate 102 and the thermally conductive pad 106. The sub-system 101 of FIG. 4A further includes the bay 110 and a number of rotatable linkages 390.

The rotatable linkages 390 are rotatably disposed on both the bay 110 and the thermally conductive plate 102. Therefore, the bay 110 can rotate upwards and away from the plate 102 to an open position, as specifically depicted in FIG. 4A via arrow 392, as well as downwards and towards (e.g., clockwise) the plate 102 to a closed position. In the example of FIG. 4A, there are two linkages 390 on the side of the bay 110 and the plate 102 shown in FIG. 4A. There may also be two linkages 390 on the other side of the bay 110 and the plate 102. In generally, there may be at least one linkage 390 on either or both sides of the bay 110 and the plate 102. When the bay 110 is in the open position as depicted in FIG. 4A, the storage device 103 is insertable into the bay 110 and removable from the bay 110, as indicated by arrow 394.

Figure 4B:
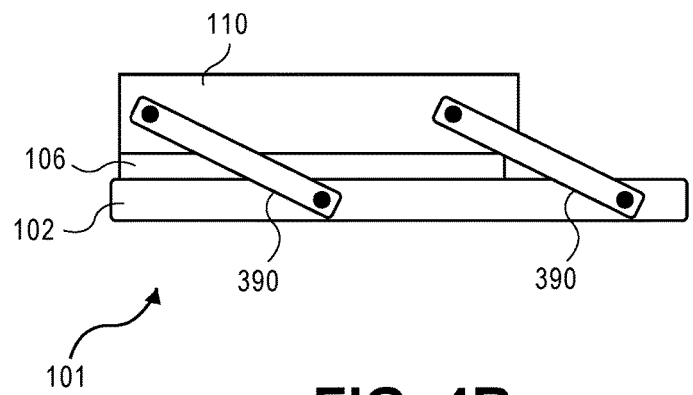
FIG. 4B is a front view diagram of the example liquid-cooling sub-system of FIG. 4A in a closed position.

FIG. 4B shows a front view of the liquid-cooling sub-system 101 in which the bay 110 has been rotated downwards and towards (e.g., counter-clockwise) the thermally conductive plate 102 in the closed position. Also depicted in FIG. 4B are the thermally conductive pad 106 and the rotatable linkages 390. The storage device 103 is not shown in FIG. 4B because it has been inserted in the bay 110. In the closed position of the bay 110, the storage device 103 within the bay 110 can compress the thermally conductive pad 106, as in FIG. 1 as has been described.

Mounting of the storage device 103 to the thermally conductive pad 106 via rotational movement of the bay 110 after the storage device 103 has been inserted into the bay 110 can be achieved in a toolless manner in the example liquid-cooling sub-system 101 of FIGS. 4A and 4B as well. Furthermore, mounting of the storage device 103 to the pad 106 as in FIGS. 4A and 4B minimizes if not eliminates translational movement of the device 103 linearly across the pad 106 during mounting. The storage device 103 may not be removable from the bay 110 in the closed position of FIG. 4B (i.e., via such linear translation), due at least to the device 103 having compressed the pad 106, rendering such removable of the device 103 difficult in this situation.

Figure 5A:
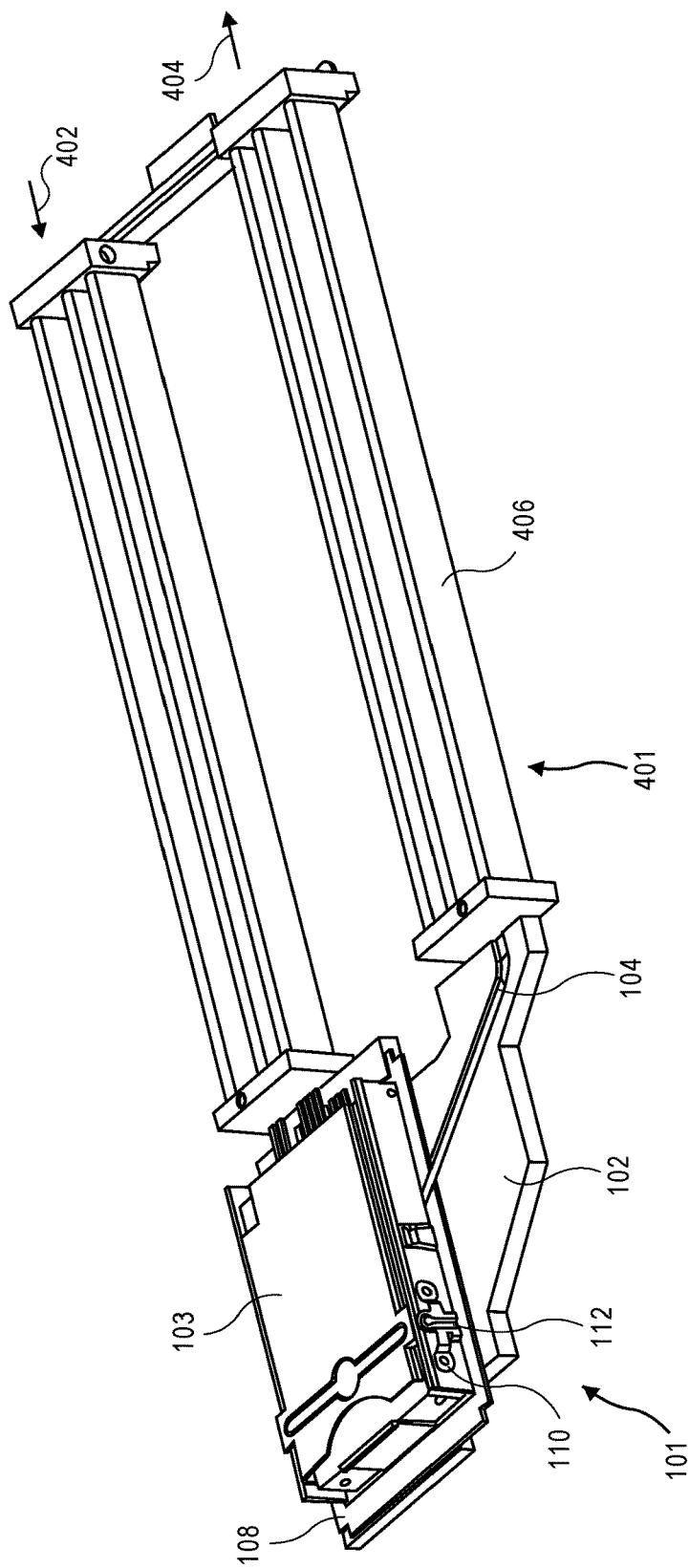
FIG. 5A is a perspective view diagram of the example liquid-cooling sub-system and the storage device of FIG. 1, and an example liquid-cooling bracket assembly.

FIG. 5A shows a perspective view of the example liquid-cooling sub-system 101, the storage device 103, and an example liquid-cooling bracket assembly 401. In the example of FIG. 5A, the sub-system 101 is that of FIG. 1, but can in another implementation by that of FIGS. 4A and 4B. The thermally conductive plate 102 with the cooling liquid channel 104 is depicted in FIG. 5A, as are the bracket 108, the bay 110, and the latch 112. The thermally conductive pad 106 is hidden in FIG. 5A, because the storage device 103 has been mounted thereto via the sub-system 101.

The thermally conductive plate 102 is attached to the liquid-cooling bracket assembly 401, which includes a number of hollow fins 406 that are fluidically coupled to the cooling liquid channel 104. Cooling liquid, such as water, can enter the bracket assembly 401 at openings at the top-most hollow fins 406, as indicated by arrow 402, and exit the assembly 401 at openings at the bottom-most hollow fins 406, as indicated by arrow 404. For instance, a pump may be employed to circulate the cooling liquid in this manner.

The cooling liquid enters the bracket assembly 401 at a lower temperature than when the cooling liquid exits the assembly 401. As the cooling liquid flows through the top-most hollow fins 406, through the cooling liquid channel 104 under the thermally conductive pad 106 that the storage device 103 is compressing, and through the bottom-most hollow fins 406, the liquid becomes heated. For instance, heat generated by the storage device 103, as well as other electronic components and devices, is conductively transferred to the cooling liquid. After the cooling liquid exits the bracket assembly 401, a heat exchanger, which may be as rudimentary as a fan, cools the cooling liquid before it reenters the assembly 401.

Figure 5B:
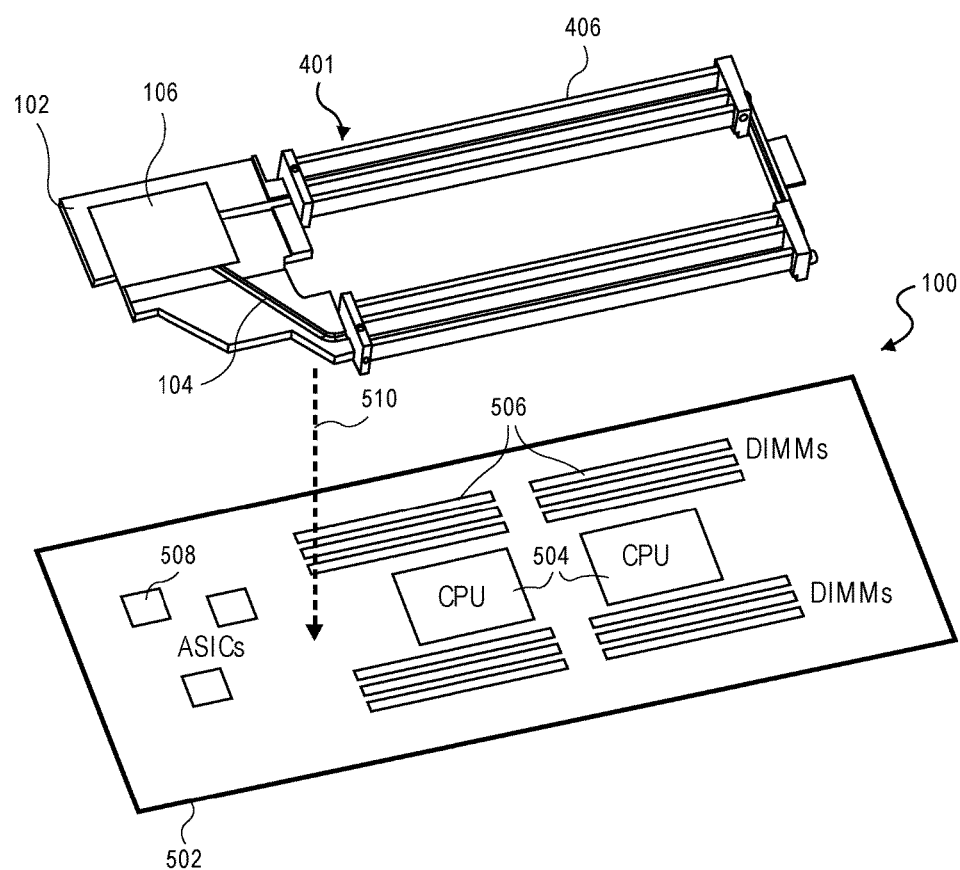
FIG. 5B is an exploded perspective view diagram of the example computing system of FIG. 1.

FIG. 5B shows an exploded perspective view of a portion of the example computing system 100, including a mainboard 502. The example liquid-cooling bracket assembly 401 having the fins 406 is depicted in FIG. 5B, as is the thermally conductive plate 102 with the cooling liquid channel 104, and the thermally conductive pad 106. The storage device 103, the bracket 108, and the bay 110 are not shown in FIG. 5B.

The mainboard 502 is a logic board, and can be the primary logic board of the computing system 100, which may be a computing device like a server, desktop, or laptop computer. The mainboard 502 includes electrical components that are removably or permanently attached thereto, such as one or more processors 504, one or more memory modules 506 like dual-inline memory modules (DIMMs), and one or more application-specific ICs (ASICs) 508. The mainboard 502 can have other electrical components disposed thereon, in addition to or in lieu of the processors 504, the memory modules 506, and the ASICs 508.

The liquid-cooling bracket assembly 401 is attached to the mainboard 502, as indicated by arrow 510. The thermally conductive plate 102 may cover the ASICs 508, so that the heat generated by the ASICs 508 is conductively transferred to the cooling liquid flowing through the cooling liquid channel 104. The fins 406 may cover or be positioned adjacent to the memory modules 506, so that the heat generated by the modules 506 is also conductively transferred to the cooling liquid flowing through the channel 104. Passive heat sinks (not shown in FIG. 5B) may be thermally attached to the processors 506, with fans directing heat generated by the processors 506 towards the fins 406 or outwards from the mainboard 502.

Figure 6:
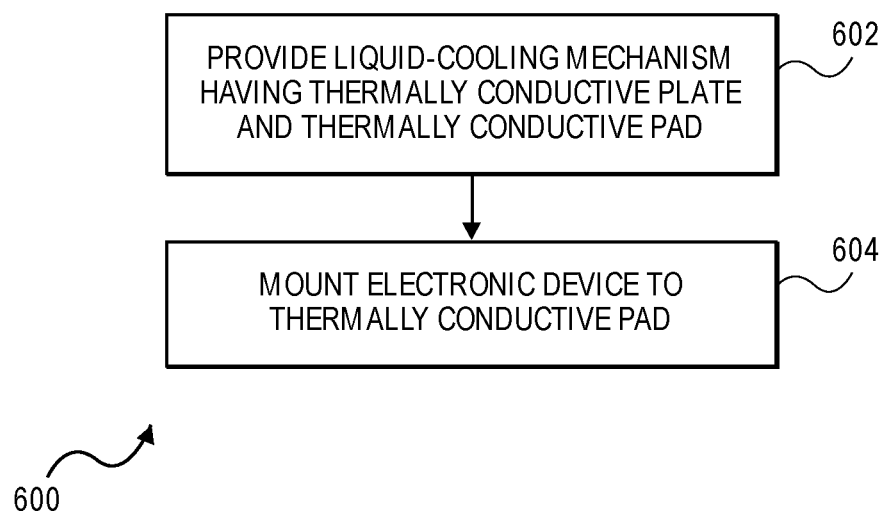
FIG. 6 is a flowchart of an example method performed in relation to the example computing system of FIG. 1.

FIG. 6 shows an example method 600 that is performed in relation to the example computing system 100 that has been described. A liquid-cooling mechanism, such as the liquid-cooling sub-system 101, is provided (602). The liquid-cooling mechanism includes the thermally conductive plate 102 and the thermally conductive pad 106. The mechanism may also include a mounting component, such as the bracket 108, the bay 110, and the latch 112.

An electronic device, like the storage device 103, is mounted to the thermally conductive pad (604). In one implementation, the electronic device may be linearly moved against the thermally conductive pad 106 along an axis perpendicular to the bottom surface of the electronic device and the top surface of the thermally conductive pad, which can be referred to as contact surfaces. Such linear movement occurs without any translational movement of these two surfaces relative to one another.

In another implementation, the electronic device can be rotated against the thermally conductive pad about a rotational axis coincident with a corner edge of the electronic device. For instance, the electronic device may be inserted into a slot of the bay 110, and the bay 110 subsequently rotated towards the thermally conductive pad 106 until the latching pin 114 of the latch 112 engages the latching hole 118 of the bay 110. The electronic device can thus be toollessly mounted to the thermally conductive pad 106. To remove the electronic device, a top portion of the latch 112 can be pressed towards the bracket 108, causing the latching pin 114 to recede from the latching hole 118, and this disengagement permits the bay 110 to be rotated away from the bracket 108 so that the device can then be removed.

The techniques that have been described provide for liquid cooling of an electronic device like a storage device. Such liquid cooling is achieved by effectively mounting the electronic device to a thermally conductive pad, in a manner that decreases, including minimizing, translational movement of the electronic device against the pad. This mounting can further be performed in a toolless manner.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. Examples of computer-readable media include both volatile such media, like volatile semiconductor memories, as well as non-volatile such media, like non-volatile semiconductor memories and magnetic storage drives. It is manifestly intended that this invention be limited only by the claims and equivalents thereof.

We claim:

1. A method comprising:
providing a liquid-cooling mechanism having a thermally conductive plate in which a cooling liquid channel is disposed and having a thermally conductive pad disposed on the thermally conductive plate, the thermally conductive plate having a bottom surface with which one or more integrated circuits (ICs) of a mainboard are in thermal contact; and
mounting an electronic device to the thermally conductive pad in a manner that decreases translational movement of a contact surface of the electronic device against a contact surface of the thermally conductive pad,
wherein mounting the component comprises:
inserting the electronic device into a bay to which a bracket is rotationally attached and that is rotated away from the thermally conductive pad, the bracket attached to the thermally conductive plate and having an opening through which the thermally conductive pad is exposed; and
rotating the bay towards and against the thermally conductive pad, causing a latching pin of a latch attached to the bracket to engage with a latching hole of the bay, maintaining the electronic device positioned against the thermally conductive pad.

2. The method of claim 1, wherein in mounting the electronic device to the thermally conductive pad, the electronic device compresses the thermally conductive pad.

3. The method of claim 1, wherein mounting the electronic device to the thermally conductive pad comprises:
linearly moving the electronic device against the thermally conductive pad along an axis perpendicular to the contact surfaces of the electronic device and the thermally conductive pad, without any translational movement of the contact surface of the electronic device occurring relative to the contact surface of the thermally conductive pad.

4. The method of claim 1, wherein mounting the electronic device to the thermally conductive pad comprises:
toollessly mounting the electronic device to the thermally conductive pad.

5. The method of claim 4, wherein inserting the electronic device within the slot of the bay causes a connector of the electronic device to conductively mate with a corresponding connector at a back of the bay.

6. The method of claim 1, wherein the electronic device has an electronic component uncovered and exposed at the contact surface of the electronic device.

7. A liquid-cooling sub-system comprising:
a thermally conductive plate having a cooling liquid channel within which cooling liquid is circulated and having a bottom surface to which one or more integrated circuits (ICs) of a mainboard are to thermally contact;
a thermally conductive pad disposed on the thermally conductive plate; and
a mounting component permitting mounting of an electronic device against the thermally conductive pad in a manner that decreases translational movement of a contact surface of the electronic device against a contact surface of the thermally conductive pad,
wherein the mounting component comprises:
a bracket attached to the thermally conductive plate and having an opening through which the thermally conductive pad is exposed;
a latch attached to the bracket and having a latching pin; and
a bay rotationally attached to the bracket, having a slot receptive to insertion of the electronic device, and having a latching hole with which the latching pin is engageable upon rotation of the bay towards the thermally conductive pad,
and wherein engagement of the latching pin with the latching hole maintains the electronic device positioned against the thermally conductive pad by the mounting component, upon the electronic device having been inserted into the slot and the bay thereafter rotated towards the thermally conductive pad.

8. The liquid-cooling sub-system of claim 7, wherein the manner in which the mounting component permits mounting the electronic device to the thermally conductive pad compresses the electronic device against the thermally conductive pad.

9. The liquid-cooling sub-system of claim 7, wherein the manner in which the mounting component permits mounting the electronic device to the thermally conductive pad comprises rotation of the electronic device against the thermally conductive pad.

10. The liquid-cooling sub-system of claim 7, wherein the manner in which the mounting component permits toolless mounting the electronic device to the thermally conductive pad compresses the electronic device against the thermally conductive pad.

11. A computing system comprising:
a mainboard having one or more integrated circuits;
a thermally conductive plate having a cooling liquid channel within which cooling liquid is circulated and having a bottom surface with which the ICs of the mainboard are in thermal contact;
a thermally conductive pad disposed on the thermally conductive plate;
an electronic device; and
a mounting component removably mounting the electronic device against the thermally conductive pad in a manner that minimizes translational movement of a contact surface of the electronic device against a contact surface of the thermally conductive pad, wherein the mounting component comprises:
- a bracket attached to the thermally conductive plate and having an opening through which the thermally conductive pad is exposed;
- a latch attached to the bracket and having a latching pin; and
- a bay rotationally attached to the bracket, having a slot receptive to insertion of the electronic device, and having a latching hole with which the latching pin is engageable upon rotation of the bay towards the thermally conductive pad, wherein engagement of the latching pin with the latching hole maintains the electronic device positioned against the thermally conductive pad by the mounting component, upon the electronic device having been inserted into the slot and the bay thereafter rotated towards the thermally conductive pad.

12. The computing system of claim 11 further comprising:
a logic board to which the thermally conductive plate is attached;
a connector at a back of the bay, to which a corresponding connector of the electronic device conductively mates.

13. The computing system of claim 11, wherein the electronic device comprises one of:
a hard disk drive;
a solid state drive.

* * * * *